US008819520B1

(12) United States Patent
Slavetsky (10) Patent No.: US 8,819,520 B1
(45) Date of Patent: Aug. 26, 2014

(54) METHOD AND SYSTEM FOR FORWARD ERROR CORRECTION IN PACKETIZED NETWORKS

(71) Applicant: "Intermind" société à responsabilité limitée, Luxembourg (LU)

(72) Inventor: Alexander Slavetsky, Moscow (RU)

(73) Assignee: "Intermind" Societe a Responsabilite Limitee, Luxembourg (LU)

( * ) Notice: Subject to any disclaimer, the term of this patent is extended or adjusted under 35 U.S.C. 154(b) by 100 days.

(21) Appl. No.: 13/759,103

(22) Filed: Feb. 5, 2013

(51) Int. Cl.
*H03M 13/00* (2006.01)
*H03M 13/05* (2006.01)

(52) U.S. Cl.
CPC ..................... *H03M 13/05* (2013.01)
USPC .......................................... 714/761; 714/762

(58) Field of Classification Search
CPC .................. H04L 1/0072; H04L 2001/0098; H04L 1/0009; H04L 1/0045; H04L 1/0057
USPC ......... 398/26, 70; 370/394; 714/752, 57, 761, 714/762
See application file for complete search history.

(56) References Cited

U.S. PATENT DOCUMENTS

| | | | |
|---|---|---|---|
| 6,170,075 | B1 | 1/2001 | Schuster et al. |
| 6,771,674 | B1 | 8/2004 | Schuster et al. |
| 7,539,187 | B2 | 5/2009 | Fellman et al. |
| 8,369,705 | B2 * | 2/2013 | de Lind van Wijngaarden .................. 398/70 |
| 2006/0150055 | A1 * | 7/2006 | Quinard et al. ............... 714/752 |
| 2007/0121639 | A1 * | 5/2007 | Degrande et al. ............ 370/394 |
| 2010/0153814 | A1 | 6/2010 | Rigaudeau et al. |
| 2010/0246788 | A1 | 9/2010 | Menard et al. |
| 2012/0002961 | A1 * | 1/2012 | de Lind van Wijngaarden .................. 398/26 |

* cited by examiner

*Primary Examiner* — David Ton
(74) *Attorney, Agent, or Firm* — Bardmesser Law Group (57) ABSTRACT

An improved method for forward error correction (FEC) in packetized networks. The proposed FEC method improves upon the conventional methods by reordering packets in advance to a certain depth. This allows for dispersing losses of groups of packets. Additionally, the method provides for a dynamic change of a current FEC scheme. In order to defend packet sequences from group losses, the FEC packets are dispersed within the packet stream in such a manner that the packets of the same sequence are located as far as possible from each other. The packets are mixed for minimization of losses and effective recovery.

6 Claims, 6 Drawing Sheets

METHOD AND SYSTEM FOR FORWARD ERROR CORRECTION IN PACKETIZED NETWORKS

BACKGROUND OF THE INVENTION

1. Field of the Invention

The present invention relates to automated network traffic management, and more particularly, to forward error correction using reordering of packets to a specific depth.

2. Description of the Related Art

Currently, there are a number of conventional methods that relate to correction of errors in networks transferring packetized data. The networks typically experience losses of packets and bursts of lost packets. A forward error correction (FEC) method is used to deal with network packet data losses. According to the FEC, additional data is added to the transferred packet data in order to compensate for the future losses.

However, a conventional FEC method is insufficient in wireless networks, where the losses often occur in bursts (i.e., groups of lost packets). The Wi-Fi environment is often unpredictable and packets are constantly lost in the Wi-Fi networks. The data is transferred in a half-duplex mode in a common frequency channel. While collision protection is implemented, the collisions take place because of attempts to simultaneously transfer data by different devices, or because of several devices operate in the same frequency range while supporting different communications protocols.

Another reason for losses is weakening of the signal due to obstructions in the propagation path of the radio waves. Video traffic is particularly sensitive to these losses. The most critical are losses of groups of consecutive packets that typically occur in wireless networks. A Real-time Transport Protocol (RTP) takes into account possible packet data losses and employs some forward error correction (FEC) using standards RFC 2733, RFC 5109 and RFC 6015. However, conventional FEC does not provide for efficient delivery of packets in wireless networks where groups of packets are often lost.

Figure 1:
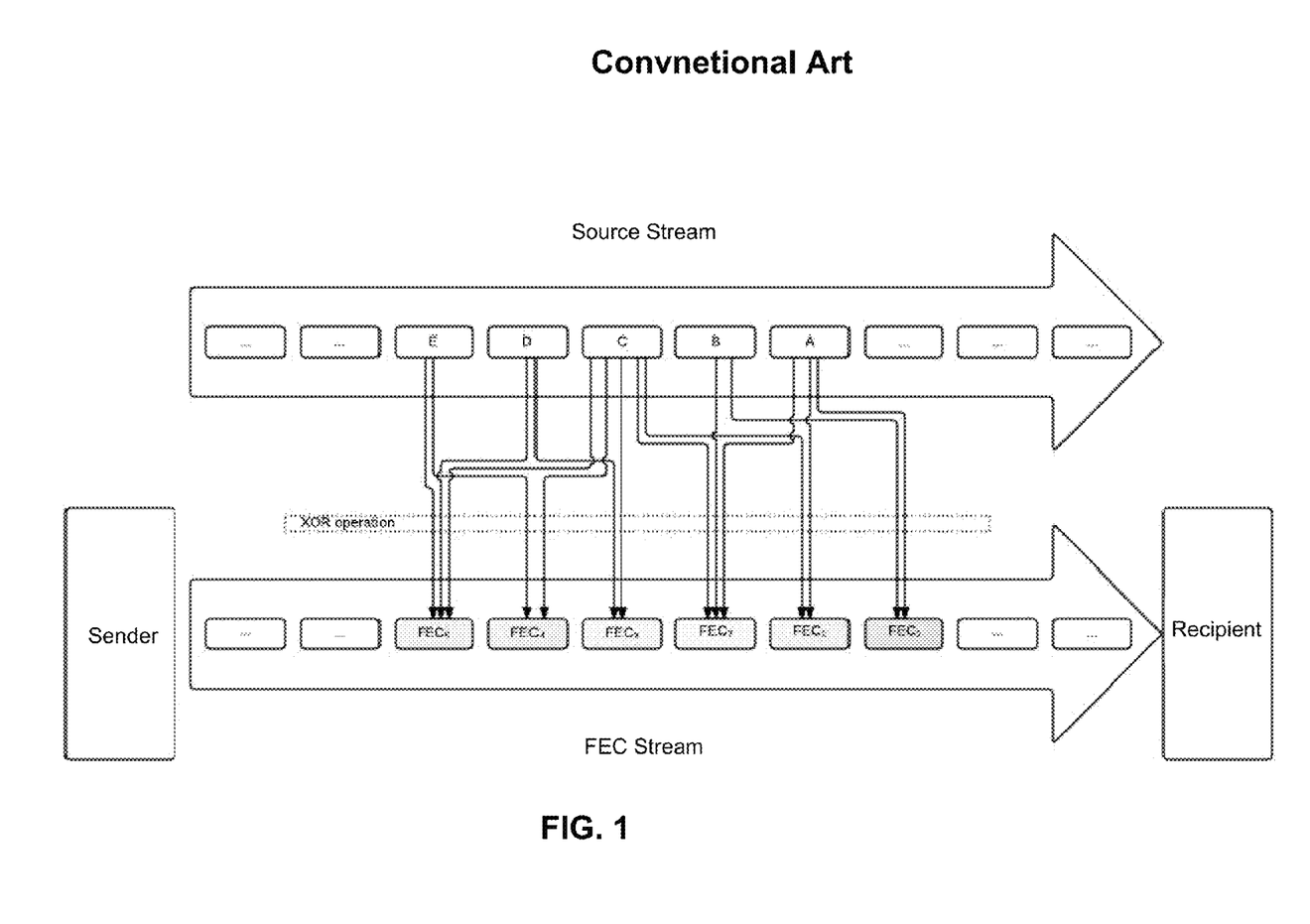
FIG. 1 illustrates a conventional forward error correction scheme, in accordance with the exemplary embodiment.

The RFC 2733 protocol forms additional FEC data packets out of basic data packets (at least two packets are used). The XOR operation is applied to the basic data packets. Alternatively, only FEC data packets are sent over a communication channel, as shown in FIG. 1. The initial data packets are "a, b, c, d, e." Instead of the initial data packets, the FEC data packets "fn1 (a,b) fn2(a,c) fn3(a,b,c) fn4(c,d) fn5(c,e) fn6(c,d,e)" are sent over the communication channel, where fn are XOR operations.

The conventional FEC scheme depicted in FIG. 1 allows for restoration of data when single packets are lost. In some cases the data can be restored if two consecutive packets are lost as well. However, in order to restore all lost packets, a loss of each third FEC packet is acceptable. Thus, a sequence of minimum of the two packets is required. In wireless networks, group packet losses occur quite frequently. The conventional FEC scheme does not address these losses.

Accordingly, there is a need in the art for an effective and efficient method for forward error correction that provides for recovery of all packet data.

SUMMARY OF THE INVENTION

The present invention relates to automated network traffic management, and more particularly, to forward error correction using reordering packets to a certain depth.

In one aspect, there is provided an improved method for forward error correction (FEC). According to an exemplary embodiment, the proposed FEC method improves upon the conventional methods by reordering packets in advance to a certain depth. This allows for dispersing of lost packets and minimizing losses of groups of packets. Additionally, the method provides for a dynamic change of a current FEC scheme.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF EMBODIMENTS OF THE INVENTION

Reference will now be made in detail to the embodiments of the present invention, examples of which are illustrated in the accompanying drawings.

A method, system and computer program product for an improved FEC is provided. The method, in accordance with the exemplary embodiment, provides for minimization and correction of losses of data packets, especially in wireless networks.

According to an exemplary embodiment, the proposed FEC method improves upon the conventional methods by reordering packets in advance to a certain depth. This allows for minimizing losses of groups of packets. Additionally, the method provides for a dynamic change of a currently utilized FEC scheme.

Selection of the depth of reordering is discussed in more detail below. The FEC scheme is selected based on the profile table. FECI (one iteration of the FEC) is the minimum length of an uninterrupted sequence of packets of the FEC algorithm, that has the property that the number of packets that are permitted to be dropped (FEC_BURST) is no greater than what is required to recover the data later. In other words, FECI and FEC_BURST are properties of the FEC algorithm.

For example, if the current FECI=3, then for a loss of 3 packet group (BURST=3), the reordering depth would be 10 (BUFSIZE=STEP*BURST+1; 10=3*3+1, where STEP is the reordering step.

Wireless networks often experience group packet losses. According to the exemplary embodiment, in order to protect packet sequences from group losses, the FEC packets are dispersed within the packet stream in such a manner that the packets of the same sequence are located as far as possible from each other (i.e., not closer than STEP, see discussion below). In other words the packets are mixed.

An FEC packet stream, according to the RFC 2733, can restore group packet losses up to the group size of FEC_BURST. Note that in addition to single packet losses, different FEC algorithms have the FEC_BURST parameter, which characterizes information recovery for burst losses. FEC_BURST depends on the FEC algorithm. The example given in RFC 2733 adds a 50% overhead, but recovers single packet losses (FEC_BURST=1) and in some corner cases, 2 packets (FEC_BURST=2): a,b,f(a,b);c,d,f(c,d)—recovers any single lost and packets and a loss of two packets f(a,b) and c. A 30% overhead scheme, also discussed in the RFC 2733, gives: f(a,b),f(a,c),f(a,b,c);f(c,d),f(c,e) f(c,d,e). The lower overhead is lower due to the transmission of only derived packets FEC(f( . . . )), the original packets (a,b,c . . . ) are not sent. The example given in RFC 2733 with 100% overhead recovers all double packet losses, (FEC_BURST=2) and in some corner cases 3 packets (FEC_BURST=3): a,f(a,b),b,f(b,c),c,f(c,d),d,f(d,e),e—any two packets, b,f(b,c),c—3 packets, will not recover 3 packets here: f(b,c),c,f(c,d). Using a reordering, it is possible to recover packet losses of burst length of 2, 3, 4, and higher (depending on reordering depth).

Figure 2:
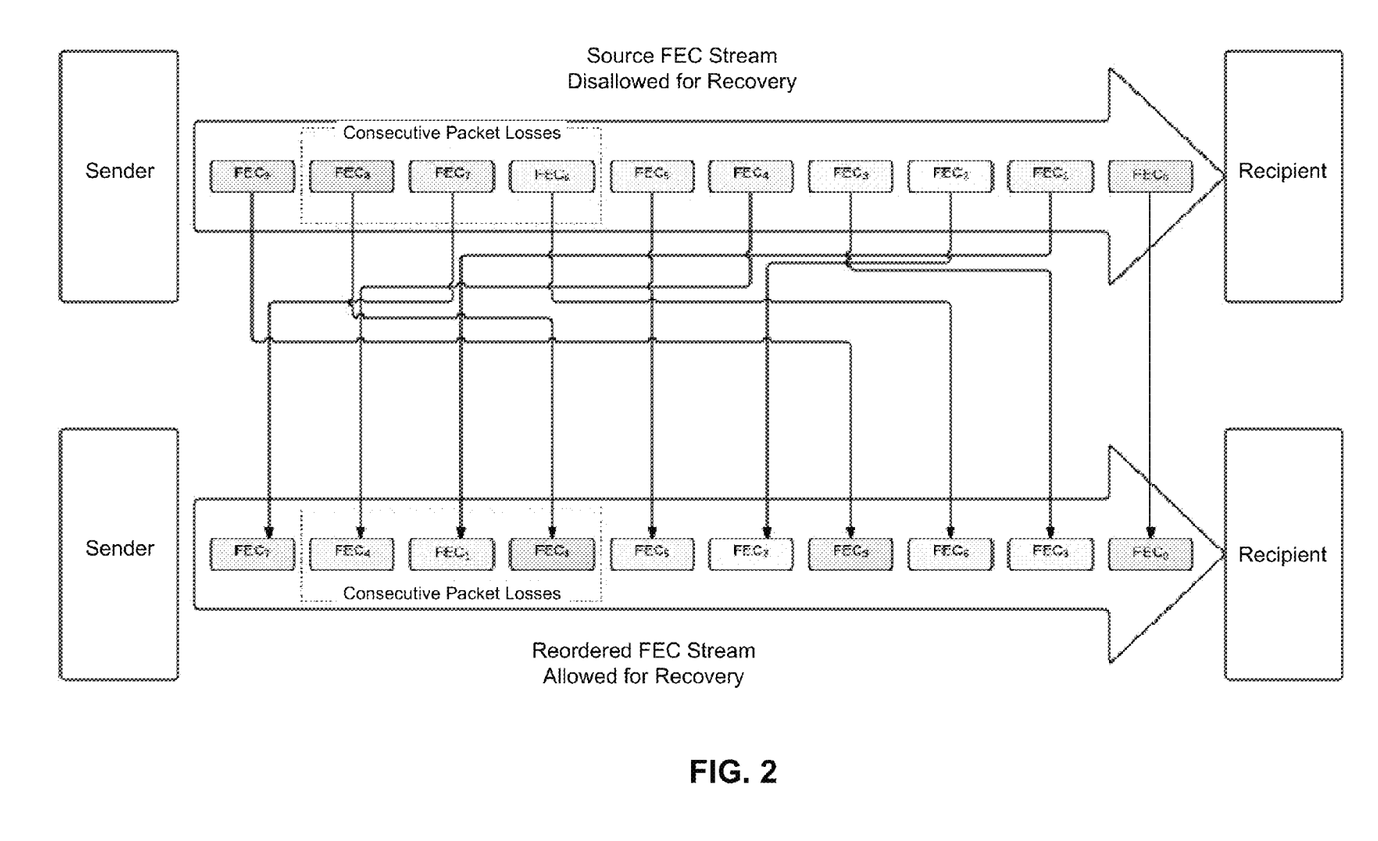
FIG. 2 illustrates a how a delay is introduced for restoration of an initial packet sequence, in accordance with the exemplary embodiment.

In the exemplary embodiment, the packets are mixed to a certain depth. Thus, the size of a restorable group is increased to FEC_BURST*X. This causes a certain delay needed for restoration of the initial packet sequence as shown in FIG. 2. According to the exemplary embodiment, the further away the packets of the same sequence are dispersed within the packet stream, the more packets need to be received at the recipient in order to restore a correct sequence of the FEC packets for subsequent transformation into the initial media packets.

If the packets are received infrequently, the restoration of the stream can be delayed. The greater the amount of data that needs to be transmitted over a network per unit time, the greater the frequency with which the packets need to be formed and sent into the network (and vice versa). For example, if video is being transmitted and is compressed using codecs that use interframe and intraframe encoding, the frequency with which packets are supplied into the network will vary, since the interframe will be divided into a larger number of RTP packets than the intraframes. Thus, the frequency with which the packets are provided to the network will vary.

The proposed method will add a delay equal to PACKET_DELAY=(BUFSIZE−STEP)* (100−FEC_OVERHEAD)/100, where FEC_OVERHEAD—is the overhead due to the FEC scheme being used. In this example, STEP=3, BUFSIZE=10, FEC_OVERHEAD=33%, then (10−3)*(100−33)/100=4,69 packets. To recalculate this into time values, TIME_DELAY=PACKET_DELAY/PPS, where PPS is the rate at which packets are provided to the channel (packets per second). For a PPS=50, TIME_DELAY=4,69/50=0,094 sec. The general equation for time delay is TIME_DELAY=(BUFSIZE−STEP)*(100−FEC_OVERHEAD)/(100*PPS). The overhead also affects the amount of the transmitted data, because each FEC packet has a size of the largest packet from the group plus 12 bytes (as required by RFC 2733).

Note that the delay is caused mostly by the low frequency of receiving the packets, rather than by the length of the packet sequence. Thus, a minimal recommended length of the packet sequence is ten with an increment step of three, for the example described above. This distribution of the packets within the channel allows for loss of up to three packets from the group. In some cases, even four consecutive packets can be lost without affecting the restoration of data.

According to the exemplary embodiment, a special data transmission scheme is implemented. Each RTP connection has a corresponding RTCP statistics report. The sender module selects an FEC scheme and a depth of reordering of the packet stream. Each FEC scheme has its own FEC iteration (FECI) and the number of burst lost packets which scheme can recover (FEC_BURST). The FEC scheme is defined by a number of elements of the initial stream involved in the FEC scheme and by the overhead introduced into the packet stream.

According to the exemplary embodiment, selection of a particular FEC scheme and/or packet reordering depends on the communication channel, as well as on the task being accomplished. For example, in some cases it is desired to maintain the quality of the initial media stream by introducing a delay, and in some cases it is desired to change the quality of the media stream without delays. Note that a fixed bit rate of the incoming stream needs to be maintained in order to collect data related to losses. The reordering of the packets does not affect the bit rate, but introduces the delay. The FEC schemes do affect the bit rate.

Thus, when the FEC scheme is changed, the bit rate of the initial media stream needs to be changed accordingly, in order to maintain a stable bit rate of the out coming stream. The more overhead is introduced by the FEC scheme, the more reduction of the initial stream bit rate is required.

According to the exemplary embodiment, the data transfer scheme meets the following criteria:

1. Acceptable deviation from the quality of the initial media stream (affects selection of the FEC scheme and the change of the bit rate of the initial stream);
2. Acceptable stream delay (affects a maximum possible size of the reordering-buffer);
3. Acceptable deviation of the common stream bit rate.

Figure 3:
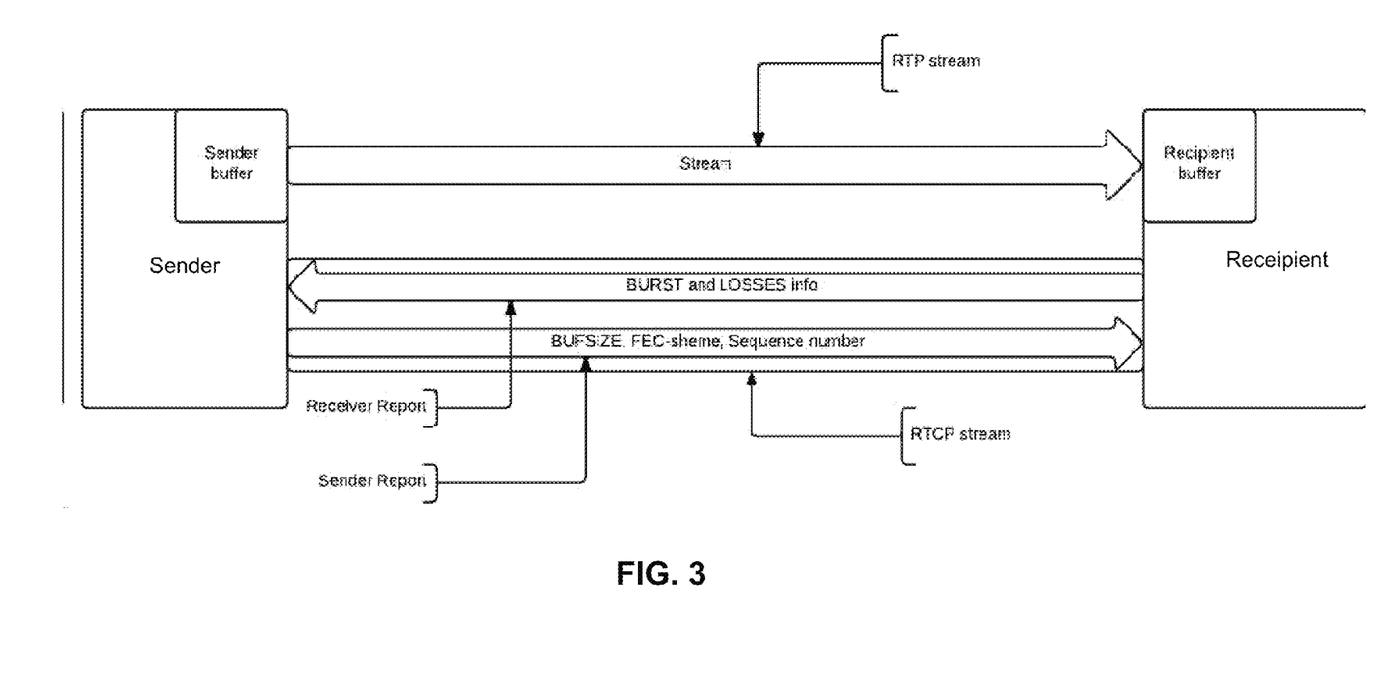
FIG. 3 illustrates a data transfer scheme, in accordance with the exemplary embodiment.

FIG. 3 illustrates a data transfer scheme, in accordance with the exemplary embodiment. A sender and a receiver each have a ring buffer for mixing and restoring sequences of the initial FEC packets. If no group losses occur in the channel, the mixing of the packets is not performed, and the buffer size equals to zero. A receiver collects statistics reflecting the losses and the bursts (i.e., group losses) based on a numbering of the received FEC packets.

The receiver sends a receiver report to the sender using the current RTCP connection. The receiver report reflects current group losses (bursts) and aggregate losses. Note that the burst value can depend not only on the size of the lost packet groups, but on a minimal number of packets received between the groups of the lost packets. For the FEC+interleaving algorithm to be able to recover data despite burst losses, the distance between the groups (bursts) needs to exceed BUFSIZE-STEP. If the distance is less than BUFSIZE-STEP, then after reversing the reordering (to recover the original sequence), some of the groups will overlap, and such two closely located bursts can be viewed as a single long burst. The receiver can also provide the sender with other user preference data (in addition to current group losses, such as low delay or image quality) reflecting selection of the sender's ring buffer.

If BURST=1, the sender employs a standard FEC scheme.

If BURST >1, the sender changes the size of the ring buffer and/or current FEC scheme and provides RTP packet sequence number to the receiver based on the data received from the receiver. The RTP packet sequence number indicates a position from which the ring buffer size changes and/or FEC scheme change at the sender. The RTP data also defines a new minimal size of the ring buffer and the selected FEC scheme.

According to the exemplary embodiment, the minimal ring buffer size is calculated as:

$$\text{BUFSIZE}=FECI\ \text{STEP}*\text{BURST}+1,$$

where STEP is the reordering step, which is given by STEP=FECI/FEC_BURST+F(X), with F(X)=0 if X=0 and F(X)=1, if X!=0.

X=FECI % FEC_BURST, where "%" is the division remainder operation and "/" is the integer division operation.

where BURST—is current group loss calculated by the receiver. The coefficient FECI is a property of a current FEC-scheme, as discussed above. Subsequently, the receiver changes the size of his ring buffer based on new buffer size and an index number of the packet, from which the size is changed.

Figure 4:
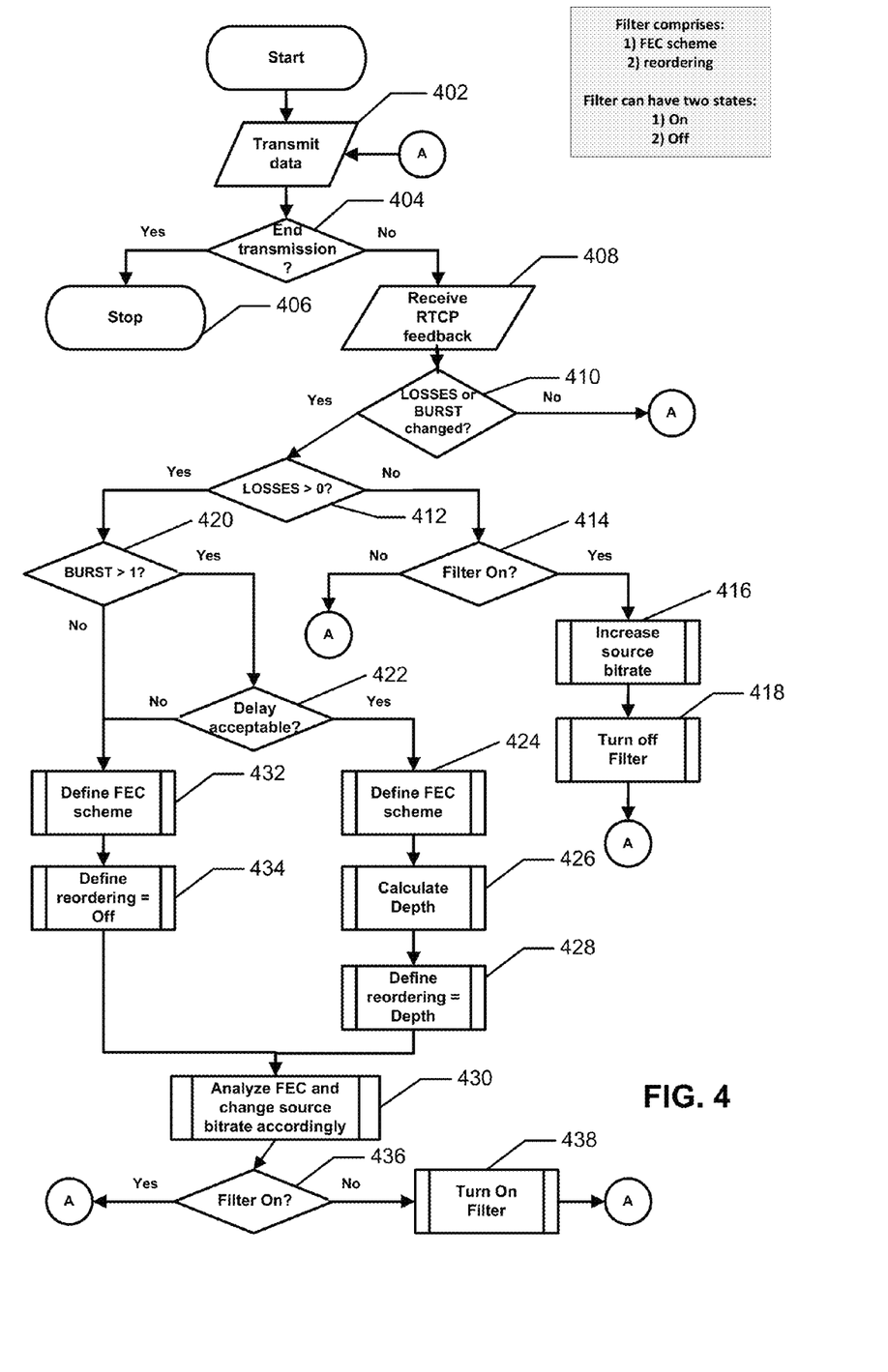
FIG. 4 illustrates a flow chart of a forward error correction method, in accordance with the exemplary embodiment.

FIG. 4 illustrates a flow chart of a forward error correction method, in accordance with the exemplary embodiment. FIG. 4 illustrates an exemplary algorithm according to the present invention. As shown in FIG. 4, once the process starts and data is transmitted (step 402), the process checks if the transmission has ended (step 404). If there is no more data transmitted, then the process ends in step 406. Otherwise, in step 408, RTP Control Procotol (RTCP—data transmission statistics indicating losses and bursts) feedback is received. Then, in step 410, the process checks if the LOSSES or BURST parameters have changed. If there had been no changes, then the process returns to step 402, where data continues to be transmitted. Otherwise, in step 412, the process checks if the LOSSES is greater than 0. If they are, then the process checks if BURST is greater than 1. If yes, then the system, in step 422, checks if the delay is unacceptable. If the delay is unacceptable after step 422, then, in step 432, the system defines the FEC scheme to be used. Also, after step 420, if the number of BURST is not greater than 1, then the process proceeds to step 432. In step 434, the reordering is turned off, and in step 430, the forward error correction is analyzed, and the source bitrate is changed accordingly.

In step 422, if the delay is acceptable, then, in step 424, the FEC scheme is defined. In step 426, the reordering depth is calculated, and in step 428, the reordering step is defined as equal to depth. Then, step 430 is performed, as discussed above.

In step 436, if the filter is on, then the process returns to step 402. Otherwise, in step 438, the filter is turned off, and the process returns to step 402.

In step 412, if the filter is on (step 414), then the source bitrate is increased in step 416, the filter is turned on in step 418, and the process returns to step 402. In step 414, if the filter is not on, the process returns to step 402.

Figure 5:
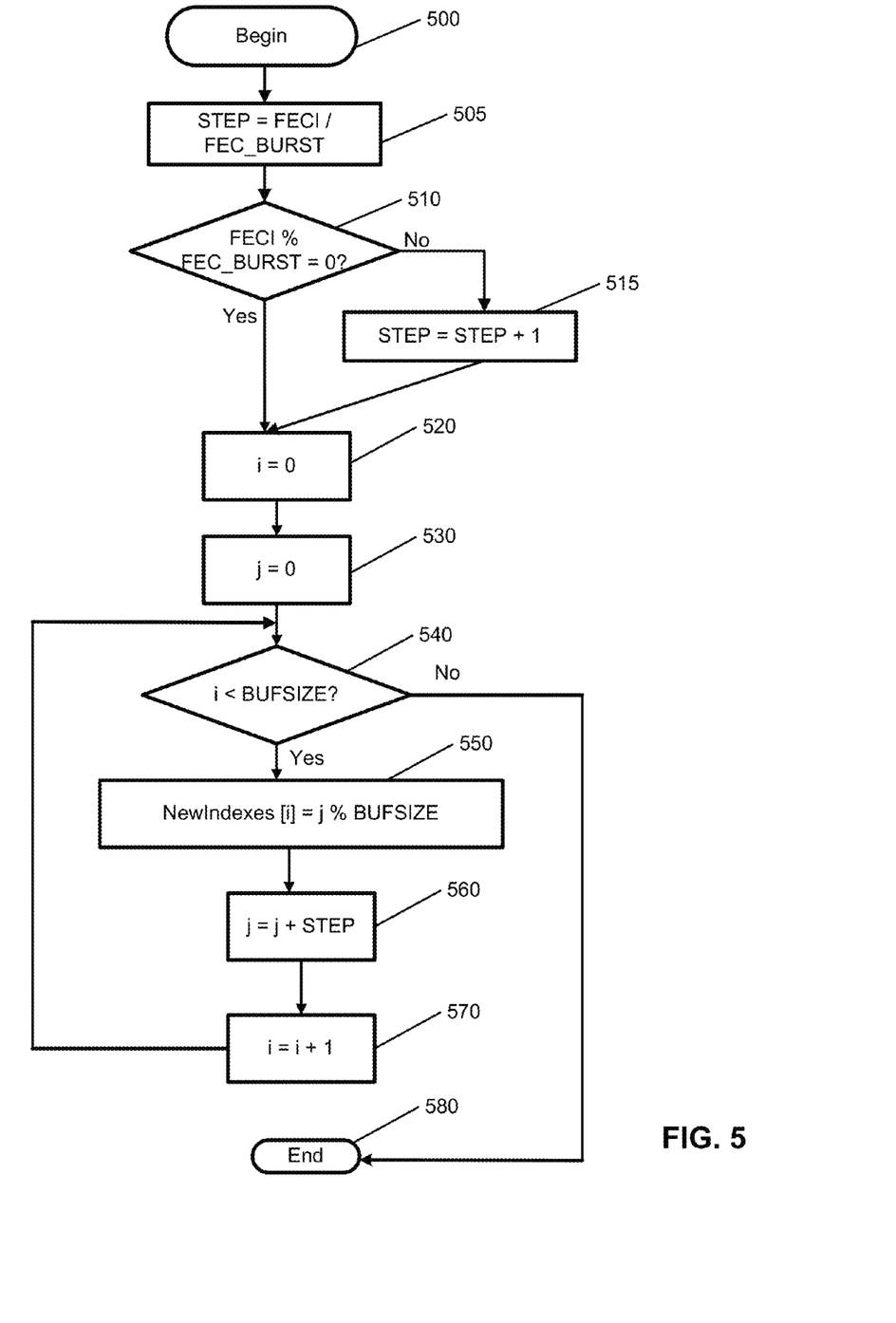
FIG. 5 illustrates a flow chart of the reordering algorithm, in accordance with the exemplary embodiment.

FIG. 5 illustrates an exemplary reordering algorithm where mixed packet numbers (indices) are calculated. The process is initiated in step 500, and then, STEP is calculated as STEP=FECI/FEC_BURST in step 505. In step 510, the parameter FECI % FEC_BURST=0? is checked. If the value is something other than 0, the STEP is incremented, in step 516. Otherwise the algorithm proceeds to step 520, where the index i is set to 0. In step 530, the index j is set to 0. In step 540, if i is less than BUFSIZE, then, in step 550, the indices are calculated as NewIndexes [i]=j % BUFSIZE.

In step 560, the j index is set as j=j+STEP. In step 570, the i index is incremented, and the process returns to step 540.

If, in step 540, i is not less than BUFSIZE, then the process ends in step 580.

Figure 6:
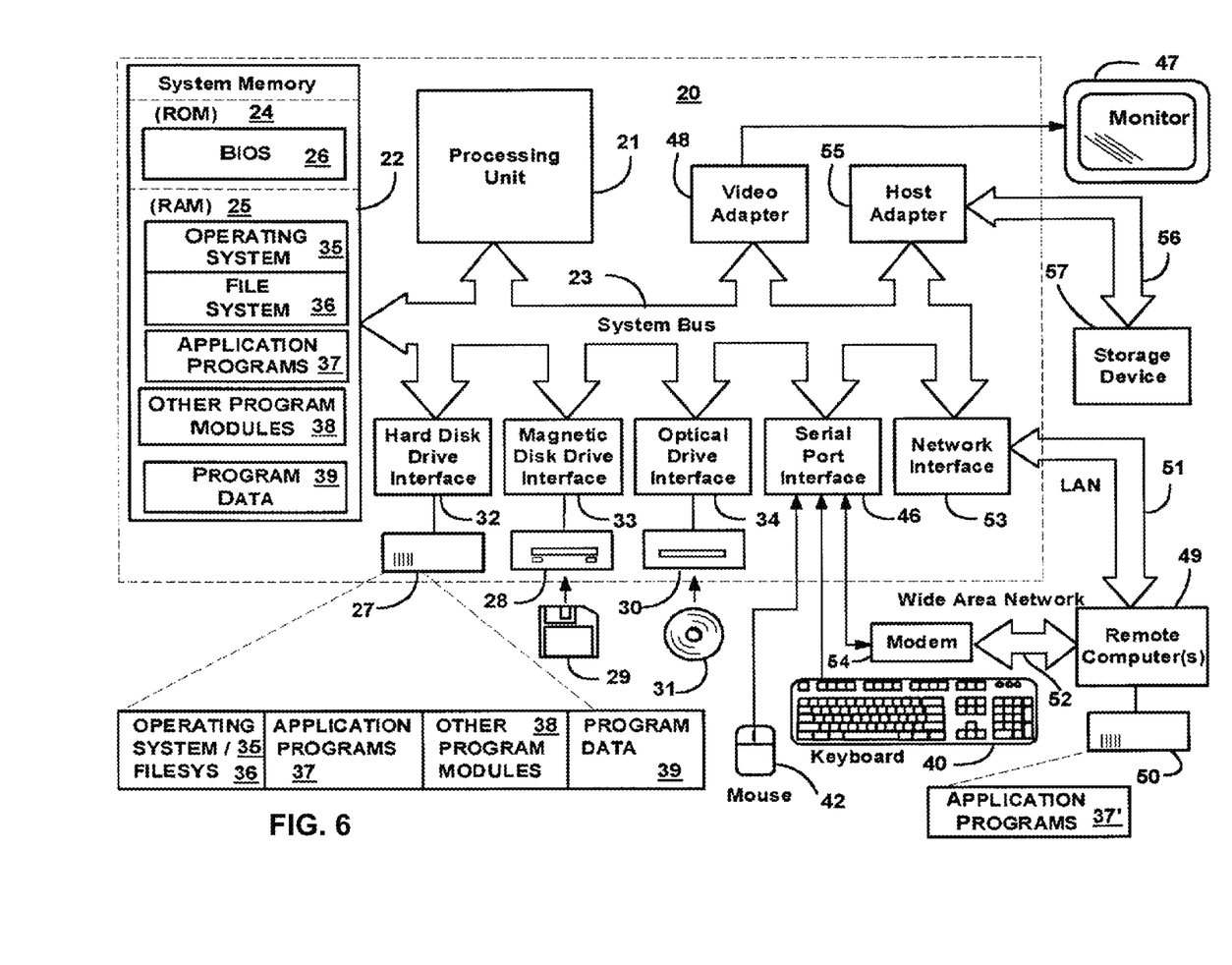
FIG. 6 illustrates a schematic diagram of an exemplary computer or server that can be used in the invention.

With reference to FIG. 6, an exemplary system for implementing the invention includes a general purpose computing device in the form of a personal computer 20 or server or the like, including a processing unit 21, a system memory 22, and a system bus 23 that couples various system components including the system memory to the processing unit 21. The system bus 23 may be any of several types of bus structures including a memory bus or memory controller, a peripheral bus, and a local bus using any of a variety of bus architectures. The system memory includes read-only memory (ROM) 24 and random access memory (RAM) 25.

A basic input/output system 26 (BIOS), containing the basic routines that help to transfer information between elements within the computer 20 or server or the like, including a processing unit 21, a system memory 22, such as during start-up, is stored in ROM 24. The personal computer 20 or the like, including a processing unit 21, a system memory 22 may further include a hard disk drive 440 for reading from and writing to a hard disk, not shown, a magnetic disk drive 28 for reading from or writing to a removable magnetic disk 29, and an optical disk drive 30 for reading from or writing to a removable optical disk 31 such as a CD-ROM, DVD-ROM or other optical media.

The hard disk drive 440, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide non-volatile storage of computer readable instructions, data structures, program modules and other data for the personal computer 20 or the like, including a processing unit 21, a system memory 22.

Although the exemplary environment described herein employs a hard disk, a removable magnetic disk 29 and a removable optical disk 31, it should be appreciated by those skilled in the art that other types of computer readable media that can store data that is accessible by a computer, such as magnetic cassettes, flash memory cards, digital video disks, Bernoulli cartridges, random access memories (RAMs), read-only memories (ROMs) and the like may also be used in the exemplary operating environment.

A number of program modules may be stored on the hard disk, magnetic disk 29, optical disk 31, ROM 24 or RAM 25, including an operating system 35 (preferably WINDOWS™ 2000). The computer 20 or the like, including a processing unit 21, a system memory 22 includes a file system 36 associated with or included within the operating system 35, such as the WINDOWS NT™ File System (NTFS), one or more application programs 37, other program modules 38 and program data 39. A user may enter commands and information into the personal computer 20 or the like, including a processing unit 21, a system memory 22 through input devices such as a keyboard 40 and pointing device 42.

Other input devices (not shown) may include a microphone, joystick, game pad, satellite dish, scanner or the like. These and other input devices are often connected to the processing unit 21 through a serial port interface 46 that is coupled to the system bus, but may be connected by other interfaces, such as a parallel port, game port or universal serial bus (USB). A monitor 47 or other type of display device is also connected to the system bus 23 via an interface, such as a video adapter 48.

In addition to the monitor 47, personal computers typically include other peripheral output devices (not shown), such as speakers and printers. A data storage device, such as a hard disk drive, a magnetic tape, or other type of storage device is also connected to the system bus 23 via an interface, such as a host adapter via a connection interface, such as Integrated Drive Electronics (IDE), Advanced Technology Attachment (ATA), Ultra ATA, Small Computer System Interface (SCSI), SATA, Serial SCSI and the like.

The computer 20 may operate in a networked environment using logical connections to one or more remote computers 49. The remote computer (or computers) 49 may be another personal computer, a server, a router, a network PC, a peer device or other common network node, and typically includes many or all of the elements described above relative to the computer 20.

The computer 20 may further include a memory storage device 50. The logical connections include a local area network (LAN) 51 and a wide area network (WAN) 52. Such networking environments are commonplace in offices, enterprise-wide computer networks, Intranets and the Internet.

When used in a LAN networking environment, the personal computer 110 is connected to the local area network 51 through a network interface or adapter 53. When used in a WAN networking environment, the personal computer 20 typically includes a modem 54 or other means for establishing communications over the wide area network 52, such as the Internet. The modem 54, which may be internal or external, is connected to the system bus 23 via the serial port interface 46.

In a networked environment, program modules depicted relative to the personal computer 20, or portions thereof, may be stored in the remote memory storage device. It will be appreciated that the network connections shown are exemplary and other means of establishing a communications link between the computers may be used.

Having thus described the different embodiments of a system and method, it should be apparent to those skilled in the art that certain advantages of the described method and apparatus have been achieved. In particular, it should be appreciated by those skilled in the art that the proposed method provides for an effective FEC scheme that minimizes group packet losses in wireless networks.

It should also be appreciated that various modifications, adaptations, and alternative embodiments thereof may be made within the scope and spirit of the present invention. The invention is further defined by the following claims.

What is claimed is:

1. A computer-implemented method for forward error correction (FEC), the method comprising:
   (a) establishing a network connection between a sender and a recipient;
   (b) setting a desired data quality and an acceptable delay for packet recovery;
   (c) transmitting a packet data stream from the sender to the recipient;
   (d) receiving statistics reflecting losses of packets, including at least quantity of losses and characteristics of bursts;
   (e) turning an FEC scheme and packet reordering off, and increasing a bit rate of the packet data stream, if no losses are detected;
   (f) if a packet loss is detected but no packet burst losses are detected, selecting an FEC scheme, and turning off reordering;
   (g) if packet burst loss is detected but delay for recovery is unacceptable, selecting an FEC scheme, and turning off packet reordering,
   (h) if packet burst loss is detected and delay for recovery is acceptable, selecting an FEC scheme and reordering the packets;
   (i) changing the bit rate of the packet data stream, if the FEC scheme was selected or changed; and
   (j) reordering data packets within the data stream, if the recovery delay is acceptable,
   wherein the packets are dispersed within the packet stream in such a manner that the packets of the same sequence are located as far as possible from each other.

2. The method of claim 1, wherein the sender selects the FEC scheme and a depth of reordering of the packet stream.

3. The method of claim 1, wherein an array of new mixed packet indexes is calculated according to a reordering algorithm.

4. The method of claim 1, wherein the sender and the receiver have a ring buffer for mixing and restoring sequences of an initial sequence of FEC packets.

5. The method of claim 4, wherein a minimal ring buffer size is proportional to a burst value.

6. A system for forward error correction in a network packet stream, comprising:
   a processor;
   a memory; and
   a computer program logic stored in the memory and executing steps (a)-(j) of claim 1 on the processor.

* * * * *